(12) United States Patent
Lichtenwalter et al.

(10) Patent No.: US 6,612,023 B1
(45) Date of Patent: *Sep. 2, 2003

(54) METHOD FOR REGISTERING A COMPONENT LEAD WITH A U-SHAPED METALIZED PAD

(75) Inventors: Guy Lichtenwalter, San Jose, CA (US); Norman D. Marschke, San Jose, CA (US)

(73) Assignee: Hewlett-Packard Development Company, L.P., Houston, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 264 days.

(21) Appl. No.: 08/709,354
(22) Filed: Sep. 6, 1996
(51) Int. Cl.[7] .................................................. H05K 3/32
(52) U.S. Cl. .............................. 29/840; 29/843; 29/832; 228/180.21; 439/59; 439/79; 439/83
(58) Field of Search .......................... 29/741, 840, 843, 29/845, 832, 839; 228/180.21, 180.22; 439/59, 62, 79, 83

(56) References Cited

U.S. PATENT DOCUMENTS

| | | | | | |
|---|---|---|---|---|---|
| 4,091,529 A | * | 5/1978 | Zaleckas | .................. | 29/843 |
| 4,303,291 A | * | 12/1981 | Dines | .................. | 29/843 |
| 5,239,748 A | * | 8/1993 | Hamilton | .................. | 29/843 |
| 5,245,750 A | * | 9/1993 | Crumly et al. | .................. | 29/840 |
| 5,441,429 A | * | 8/1995 | Seidler | .................. | 29/843 X |
| 5,457,879 A | * | 10/1995 | Gurtler et al. | .................. | 29/845 X |
| 5,468,920 A | * | 11/1995 | August | .................. | 174/267 |
| 5,541,367 A | * | 7/1996 | Swamy | .................. | 29/840 X |
| 5,713,126 A | * | 2/1998 | Sakemi | .................. | 29/843 |

* cited by examiner

*Primary Examiner*—Richard Chang
(74) *Attorney, Agent, or Firm*—Jack A. Lenell

(57) ABSTRACT

A method and apparatus for printed circuit board pads with registering feature for component leads. A U-shaped metalized pad is disposed on a printed circuit board for soldering to a component lead. Solder is disposed on the pad and heated to a molten state so that surface tension and wetting effects form the molten solder into a solder mound having a U-shaped lateral cross section conforming to the U-shaped metalized pad. The solder mound has a first arm and a second arm, and a lateral aperture extending therebetween for receiving an extremity of the component lead, and registering the extremity of the component lead with respect to the pad.

5 Claims, 16 Drawing Sheets

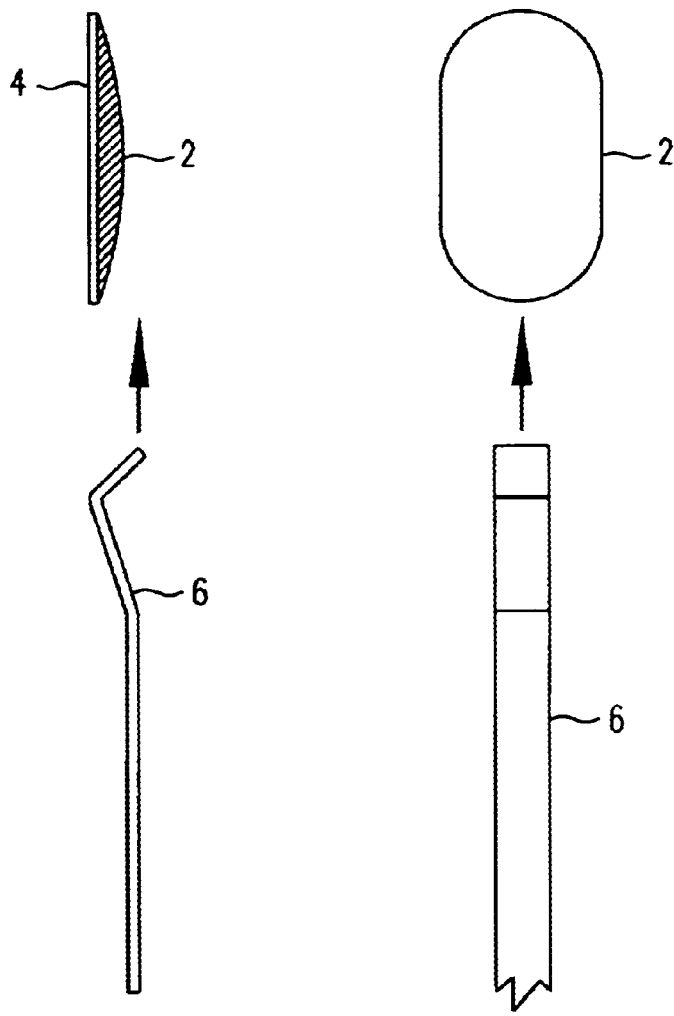

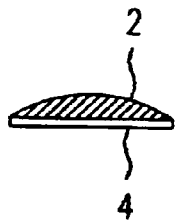
FIG. 3B
FIG. 3C
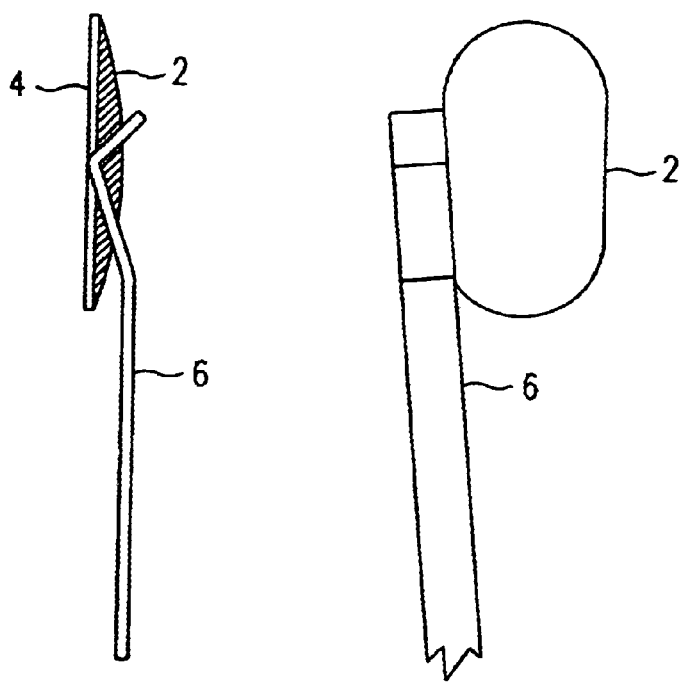
FIG. 3A

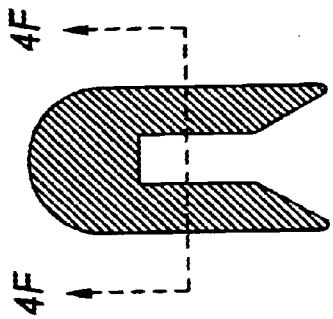
FIG. 4A  FIG. 4C  FIG. 4E
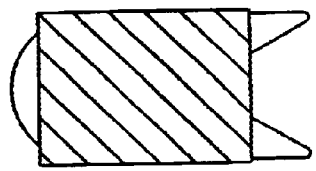
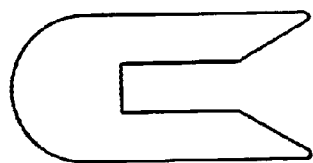
FIG. 4B  FIG. 4D  FIG. 4F

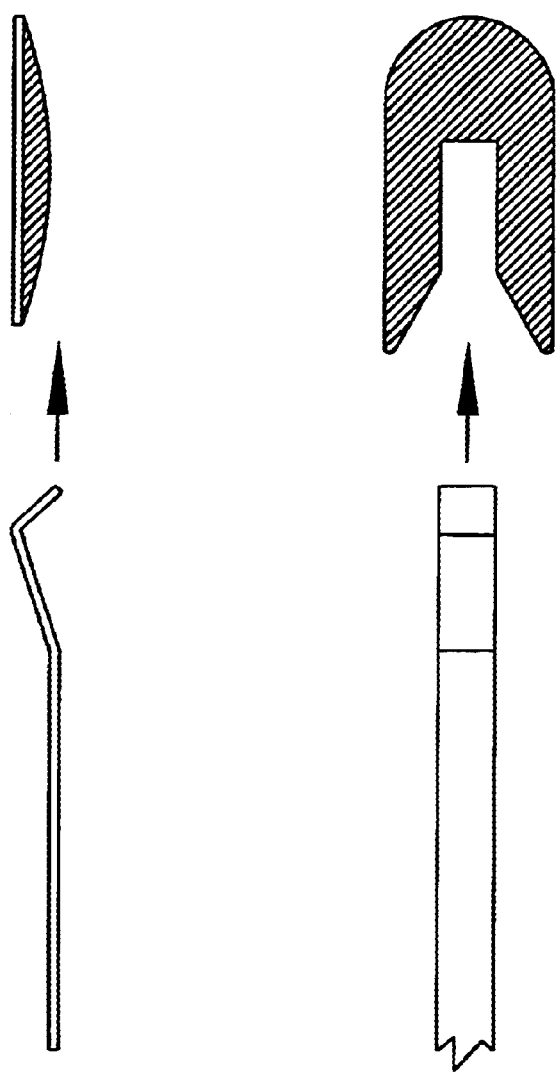

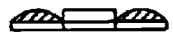
FIG. 6B
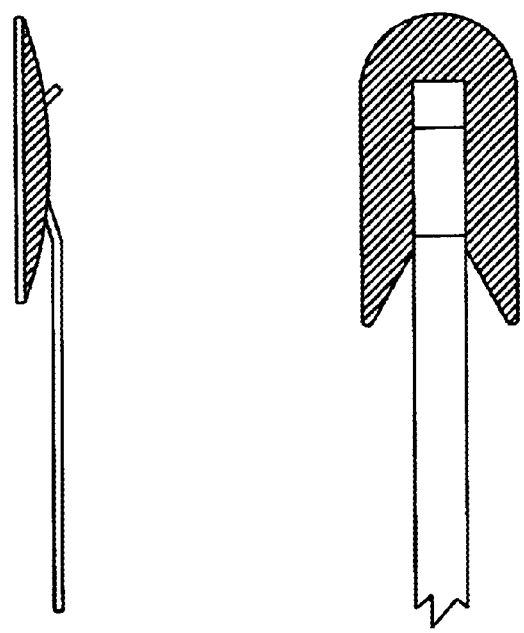
FIG. 6A
FIG. 6C

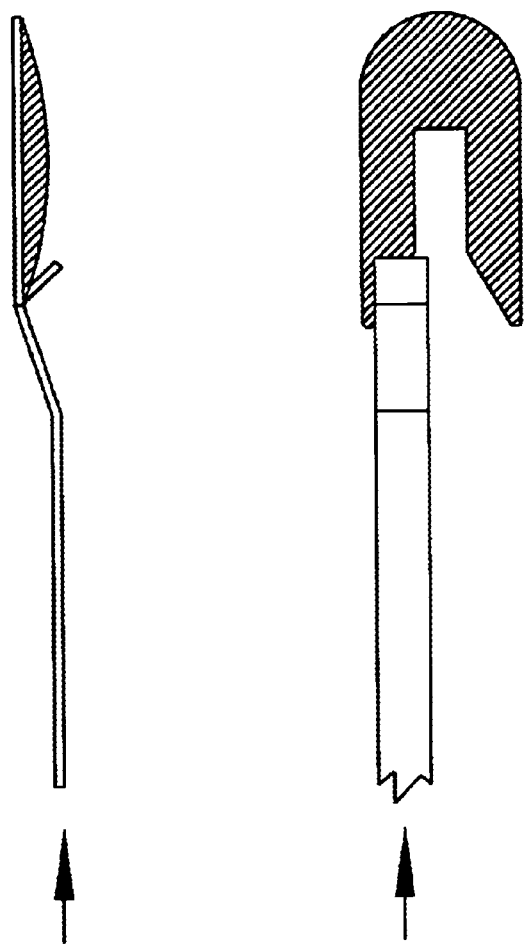

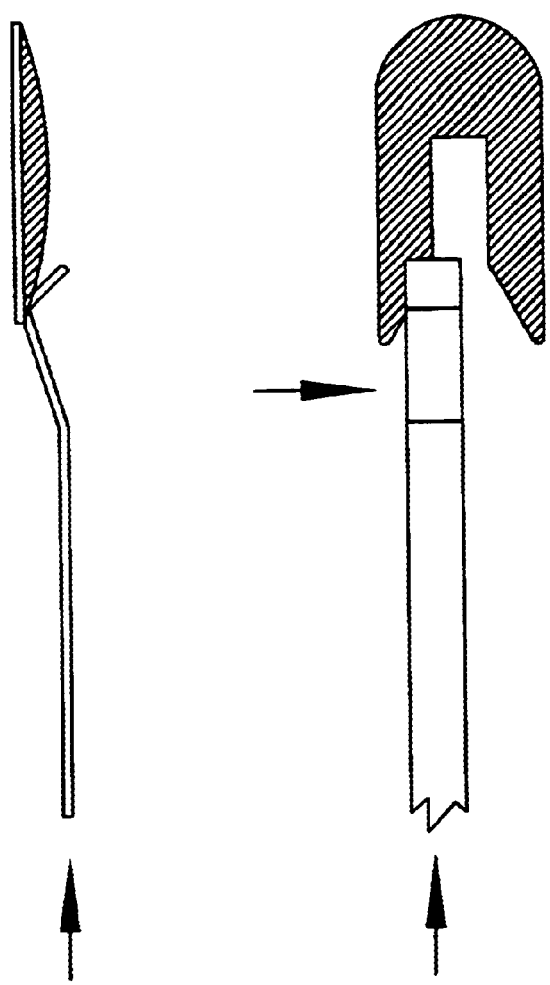

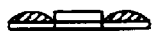
FIG. 11B
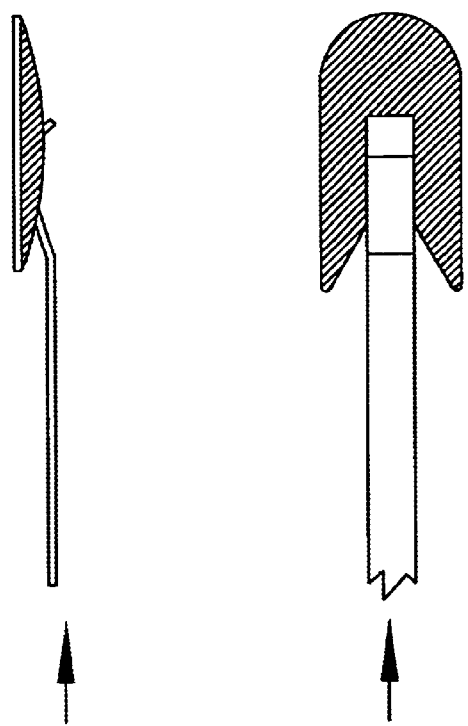
FIG. 11A
FIG. 11C

METHOD FOR REGISTERING A COMPONENT LEAD WITH A U-SHAPED METALIZED PAD

FIELD OF THE INVENTION

The present invention generally relates to the field of electronic assembly and more particularly relates to electronic component interconnects in electronic assemblies.

BACKGROUND OF THE INVENTION

Electronic assemblies typically employ printed circuit boards for mechanical support and electrical interconnection of electronic components. In the case of surface mount electronic components, component leads are placed onto metal pads deposited onto a surface of the boards. Solder is used to attach the components leads to the pads and to electrically connect the components leads to the pads. The pads are electrically interconnected by traces, or connected to an internal conductive plane of the circuit board through a metal plated aperture extending into the circuit board, called a via, so as to provide for electrical interconnection of the components.

In an assembly process, solder paste is placed onto the pads on a first side of the printed circuit board. Components are arranged on the first side of the circuit board so that component leads cling to the solder paste in appropriate locations. The paste is heated to solder the components to the pads on the first side of the printed circuit board. The solder is allowed to cool and harden.

After the solder on the first side of the printed circuit board is hardened, enhanced component density is achieved by turning the printed circuit board over, placing solder paste onto the pads on the other side of the printed circuit board and arranging components on the other side of the circuit board so that component leads cling to the solder paste in appropriate locations. The paste is heated to solder the components to the pads on the other side of the printed circuit board. The solder is again allowed to cool and harden.

It should be understood that flexibility in order of soldering operations is limited since the solder paste on the first side of the circuit board is heated, cooled and hardened before any solder paste is applied to the other side of the printed circuit board. If solder paste and components were applied to both sides of the printed circuit board before any heat were applied to either side, it is likely that the pull of gravity or vibrations would displace some of the components, since the solder paste has insufficient adhesive power to retain positioning of components so effected. Flexibility in order of soldering operations is particularly limited when the components include components that must be soldered to pads on both sides of the printed circuit board, such as straddle mount connectors.

It is important to achieve and maintain correct positioning of components in soldering operations. Misregistered component leads cause electrically or mechanically defective solder joints, requiring costly and time consuming rework operations. Misregistered component leads may also cause circuit shorting and catastrophic electrical failure of the entire electronic assembly.

What is needed is a method and apparatus for printed circuit board pads with registering feature for component leads.

SUMMARY OF THE INVENTION

The present invention provides a method and apparatus for printed circuit board pads with registering feature for component leads.

Briefly, and in general terms the invention provides a U-shaped metalized pad on a printed circuit board for soldering to a component lead. Solder is disposed on the pad and heated to a molten state so that surface tension and wetting effects form the molten solder into a solder mound having a U-shaped lateral cross section conforming to the U-shaped metalized pad. The solder mound has a first arm and a second arm, and a lateral aperture extending therebetween for receiving an extremity of the component lead. The solder mound also has a bridge portion extending between the first and second arms of the solder mound. The solder mound is cooled so as to harden the solder mound.

The extremity of the component lead is disposed proximate to the lateral aperture between the first arm and second arm of the solder mound. By sliding the extremity of the component lead in contact with the first arm and second arm of the solder mound, the component lead is registered with respect to the pad in a lateral dimension perpendicular to the arms of the mound. The lateral aperture of the solder mound receives the extremity of the component lead. By sliding the extremity of the component lead into contact with the bridge portion of the solder mound, the component lead is registered with respect to the pad in a lateral dimension perpendicular to the bridge portion of the solder mound. The solder mound is then heated to a molten state so as to solder the component lead to the pad.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIGS. 1A, 1B, 2A–C, and 3A–C show various views of solder pad research investigations.

FIGS. 4A and 4B show a detailed plan and front view of a U-shaped metalized pad of a preferred embodiment of the invention.

FIGS. 4C and 4D show a detailed plan and front view of solder paste disposed on the pad of FIGS. 4A and 4B.

FIGS. 4E and 4F show a detailed plan and cross sectional view of a preferred solder mound of the invention conforming to the pad of FIGS. 4A and 4B.

FIGS. 5A–5C to 11A–11C are various views illustrating a registration feature of the invention.

DETAILED DESCRIPTION OF PREFERRED EMBODIMENT

Figure 1A:
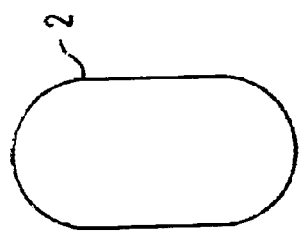
Figure 1B:
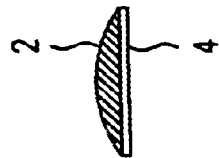
Figures 7A, 7B, 7C:
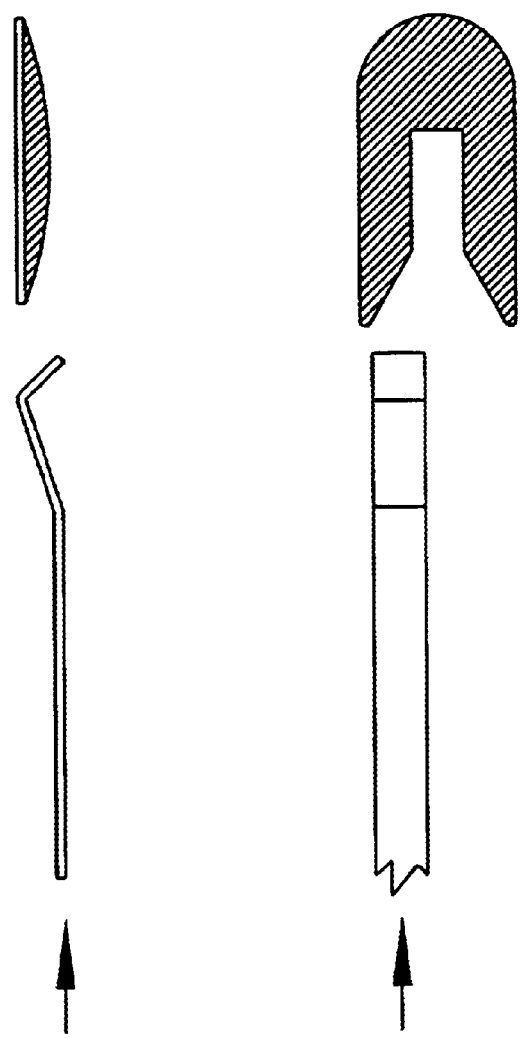
Figures 10A, 10B, 10C:
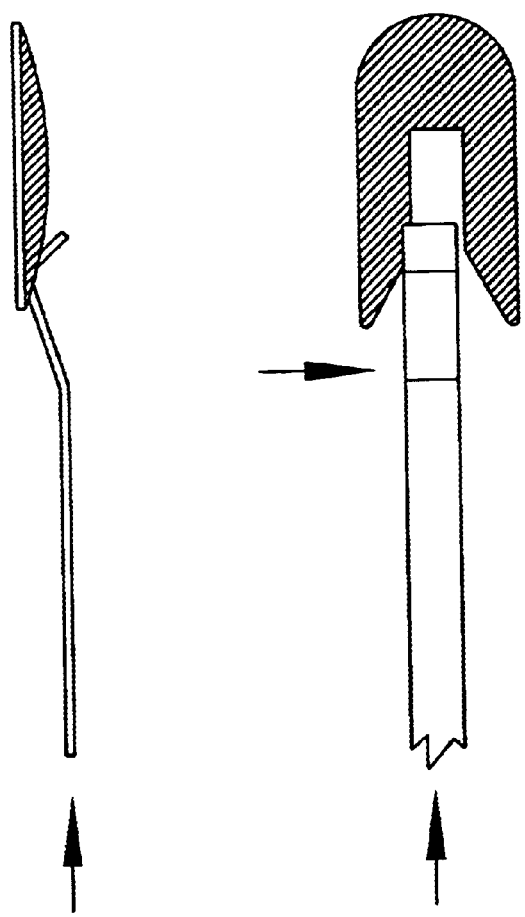

FIGS. 1A, 1B, 2A–C, and 3A–C show various views of solder pad research investigations. In an assembly process, solder paste is placed onto the pads and is melted or "reflowed" into a molten state. A wetting effect spreads the molten solder out to pad edges so as to cover a respective surface of each pad. A surface tension effect causes the molten solder to form a respective solder mound 2 covering each pad, 4 for example as shown in plan view and cross sectional view in FIGS. 1A and 1B. The solder mound is allowed to cool and harden. After component placement on top of the solder mounds, heat is applied to reflow the solder, so as to solder the component leads to the pads.

Leads of each surface mount component are placed onto the tops respective solder mounds of the pods using a combination of motions. In some cases, components are set down onto the board and then pushed laterally using sliding motions across the surface of the board, until leads of each component are in correct lateral position with respect to the pads. Alternatively, components are laterally positioned while substantially above the surface of the board, and then placed onto pads using a motion that is perpendicular to a surface of the board. So called "pick and place machines" are easily adjusted for correct perpendicular motion, but adjustment for correct lateral positioning is limited.

For correct lateral positioning, the component leads are registered with the pads by precisely adjusting position of each component lead in correspondence with the respective pad. Correct lateral positioning is sometimes difficult to achieve and maintain since weight of the components, undesired vibrations, or resiliency of the component leads cause the component leads to slip off the tops of the solder mounds, slide down sloped sides of the solder mounds, and misregister with respect to the pads.

For example, as shown in plan view, cross sectional view, and side view in FIGS. 2A, 2B, and 2C, a component lead 6 is slid towards the solder mound covering the pad. However correct lateral positioning is not achieved or maintained because the component lead slips off the top of the solder mound, slides down sloped side of the solder mounds, and misregisters with respect to the pad, as shown in plan view, cross sectional view, and side view in FIGS. 3A, 3B, and 3C.

It is important to achieve and maintain correct lateral positioning of components in soldering operations. Misregistered component leads cause electrically or mechanically defective solder joints when heat is applied to reflow the solder, requiring costly and time consuming rework operations. Misregistered component leads may also cause circuit shorting and catastrophic electrical failure of the entire electronic assembly.

FIGS. 4A and 4B show a detailed plan and front view of a U-shaped metalized pad 101 of a preferred embodiment of the invention. The pad 101 is preferably plated, deposited, or otherwise disposed on a printed circuit board for soldering to a component lead. Solder paste 103 is disposed on the pad 101 as shown in detailed plan and front views in FIGS. 4C and 4D. The solder paste 103 is heated to a molten state so that surface tension and wetting effects form the molten solder into a solder mound 105 having a U-shaped lateral cross section and conforming to dimensions of the U-shaped metalized pad 101 as shown in plan and cross-sectional views in FIGS. 4E and 4F. Accordingly, just as the U-shaped pad 101 has a first arm 121, and a second arm 123, and a lateral aperture 125 extending therebetween for receiving an extremity of the component lead, so also does the solder mound 105 have a first arm 131 and a second arm 133, and a lateral aperture 135 extending therebetween for receiving the extremity of the component lead and opposing the lateral aperture. Just as the U-shaped pad 101 has a bridge portion 127 extending between the first and second arms 121, 123 of the pad 101, so also does the solder mound 105 have a bridge portion 137 extending between the first and second arms 131, 133 the solder mound. The solder mound 105 is cooled so as to harden the solder mound 105.

Preferably, sufficient solder paste is used so that the solder mound has a height dimension within a range of five thousandths (0.005) of an inch to twenty thousands (0.020) of an inch. It is theorized that if the height dimension of the solder mound is substantially less than five thousandths (0.005) of an inch, there will be an insufficient amount of solder and a corresponding solder joint will lack mechanical strength. It is theorized that if the height dimension of the solder mound is substantially greater than twenty thousandths (0.020) of an inch, then excess solder may cause undesirable solder bridging to adjacent pads. Preferably, the height dimension the solder mound is approximately ten thousandths (0.010) of an inch.

As shown in plan view, cross sectional view, and side view in FIGS. 5A, 5B, and 5C, the extremity 141 of the component lead 143 is disposed proximate to the lateral aperture between the first arm and second arm of the solder mound. By sliding the extremity 141 of the component lead 143 in contact with the first arm and second arm of the solder mound, the component lead is registered with respect to the pad in a lateral dimension perpendicular to the arms of the mound, as shown in plan view, cross sectional view, and side view in FIGS. 6A, 6B, and 6C. The lateral aperture of the solder mound receives the extremity of the component lead. By sliding the extremity of the component lead into contact with the bridge portion of the solder mound, the component lead is registered with respect to the pad in a lateral dimension perpendicular to the bridge portion of the solder mound. Preferably, dimensions of the pad and solder mound are selected so that a main angled contact point of the extremity of the component lead is centrally disposed with respect to the pad and solder mound upon registration with the arms and bridge portion, as shown in FIGS. 6A, 6B, and 6C.

The solder mound is then heated to a molten state so as to solder the component lead to the pad. The registering feature of the invention is particularly advantageous, since it is important to achieve and maintain correct lateral positioning of the component lead with respect to the pad. Misregistered component leads would cause electrically or mechanically defective solder joints when heat is applied to reflow the solder, requiring costly and time consuming rework operations.

Aspects of the registering feature of the preferred embodiment of the invention are further shown in FIGS. 7–11. In accordance with the principles of the invention for correct lateral positioning, a registering feature of the invention provides for the component lead registering with the pad by precisely adjusting position of each component lead in correspondence with the pad. An example of a component lead that is laterally mis-aligned with respect to the pad and solder mound as shown in plan view, cross sectional view, and side view in FIGS. 7A, 7B, and 7C. As shown in plan view, cross sectional view, and side view in FIGS. 8A, 8B, and 8C, 9A, 9B, and 9C and 10A, 10B, and 10C, the extremity of the component lead slides in contact with the solder mound, engaging the first arm of the solder mound for correcting lateral alignment of the component lead with respect to the pad and solder mound. Resiliency of the component lead causes the component lead to slide along a sloped side of the arm of the solder mound, and laterally register with respect to the pad in the lateral aperture of the solder mound. As shown in plan view, cross sectional view, and side view in FIGS. 11A, 11B, and 11C in the preferred embodiment the sliding motion of the extremity of the component lead continues so as to engage both the first and second arm of the solder mound, so that the component lead is registered with respect to the pad in a lateral dimension perpendicular to the arms of the mound, as shown.

Figure 12A:
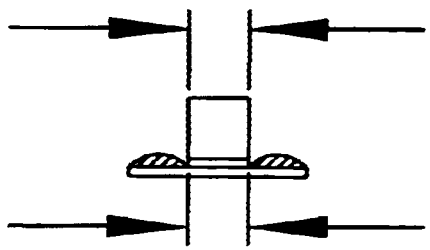
FIG. 12A is a cross sectional view of the preferred embodiment of the invention.
Figure 12B:
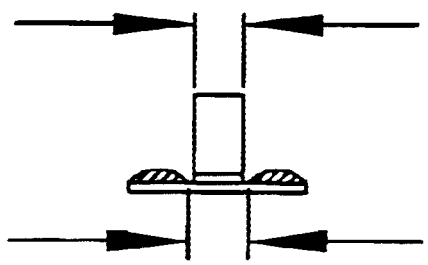
FIGS. 12B and 12C are cross sectional views of alternative embodiments of the invention.
Figure 12C:
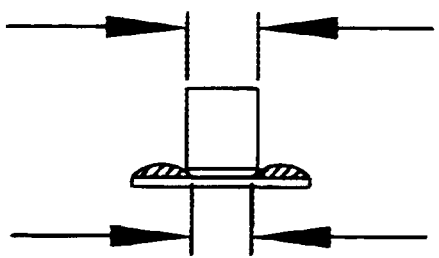

For preferred solder wetting of the component lead by both arms of the solder mound, width dimension of the lateral aperture of the solder mound (and the pad) is substantially the same as a width dimension of the component lead, so that the lateral aperture of the solder mound receives the extremity of the component lead as shown in cross sectional view in FIG. 12A. However it should be understood that the invention is not strictly limited to the lateral aperture of the solder mound being substantially the same as the width dimension of the component lead. For example, in an alternative embodiment as shown in cross sectional view in FIG. 12B, the width dimension of the lateral aperture of the solder mound is substantially larger than the width dimension of the component lead. In another alternative embodiment as shown in cross sectional view in FIG. 12C, the width dimension of the lateral aperture of the solder mound is substantially smaller than the width dimension of the component lead.

Preferably the width dimension of the lateral aperture of the solder mound (and the pad) is within a range of approximately five thousandths (0.005) of an inch to approximately twenty thousandths (0.020) of an inch. It is theorized that if the width dimension of the lateral aperture of the solder mound (and the pad) is substantially less than five thousandths (0.005) of an inch, then the corresponding width of the component lead received by the lateral aperture would be too thin and therefore lacking in mechanical strength. It is theorized that if the width dimension of the lateral aperture of the solder mound (and the pad) is substantially greater than twenty thousandths (0.020) of an inch then the corresponding width of the component lead received by the lateral aperture would be too thick and therefore limit component density. Preferably, the width dimension of the lateral aperture of the solder mound (and the pad) is approximately ten thousandths (0.010) of an inch.

Figure 13A:
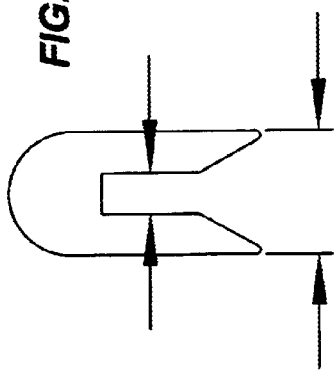
FIGS. 13A–13D are plan views illustrating various preferred dimensions of the pad and solder mound of the invention.

As shown in plan view in FIG. 13A, preferably the lateral aperture of the solder mound (and the pad) has a tapered portion, represented as an initial flared portion that is wider than the width of the lateral aperture, so as to promote capture and registration of the extremity of the component lead. Preferably, a width dimension of the initial flared portion of the lateral aperture of the solder mound (and the pad) is within a range of approximately twenty thousandths (0.020) of an inch to approximately forty thousandths (0.040) of an inch. It is theorized that if the width dimension the initial flared portion of the lateral aperture of the solder mound (and the pad) is substantially less than twenty thousandths (0.020) of an inch, then capture and registration of the component lead may be limited in some instances. It is theorized that if the width dimension of the initial flared portion of the lateral aperture of the solder mound (and the pad) is substantially greater than forty thousandths (0.040) of an inch, then pad and component density would be limited. Preferably, the width dimension of the initial flared portion of the lateral aperture of the solder mound (and the pad) is approximately thirty thousandths (0.030) of an inch.

Figure 13B:
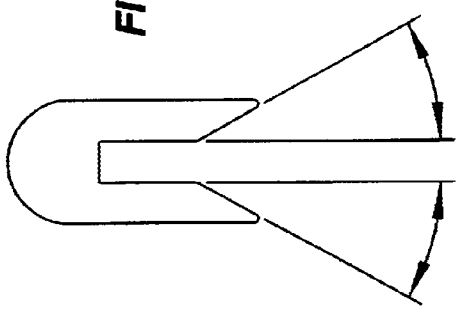

To promote capture and registration of the extremity of the component lead, a flare angle of the initial flared portion of the lateral aperture of the solder mound (and the pad) is within a range of substantially more than zero degrees to substantially less than ninety degrees. Preferably, the flare angle of the initial flared portion of the lateral aperture of the solder mound (and the pad) is approximately forty-five degrees, as shown in plan view in FIG. 13B.

Figure 13C:
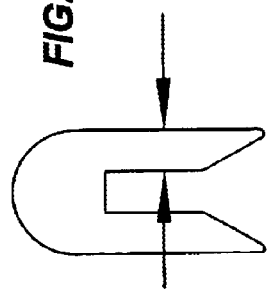

Preferably the width dimension of each arm of the solder mound (and the pad) is within a range of approximately three thousandths (0.003) of an inch to approximately fifteen thousandths (0.015) of an inch, as shown in plan view in FIG. 13C. It is theorized that if the width dimension of each arm of the solder mound (and the pad) is substantially less than three thousandths (0.003) of an inch, then there will be insufficient solder wetting of the pad and component lead. It is theorized that if the width dimension of each arm of the solder mound (and the pad) is substantially greater than fifteen thousandths (0.015) of an inch, then pad and component density would be limited. Preferably, the width dimension of each arm of the solder mound (and the pad) is approximately ten thousandths (0.010) of an inch.

Figure 13D:
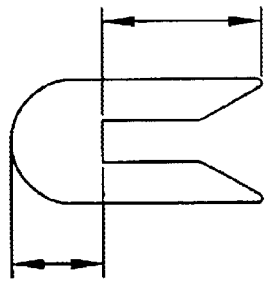

Preferably the length dimension of each arm of the solder mound (and the pad) is within a range of approximately twenty thousandths (0.020) of an inch to approximately fifty thousandths (0.050) of an inch, as shown in plan view in FIG. 13D. It is theorized that if the length dimension of each arm of the solder mound (and the pad) is substantially less than twenty thousandths (0.020) of an inch, then capture and registration of the extremity of the component lead may be limited in some instances. It is theorized that if the length dimension of each arm of the solder mound (and the pad) is substantially greater than fifty thousandths (0.050) of an inch, then pad and component density would be limited. Preferably, the length dimension of each arm of the solder mound (and the pad) is approximately thirty-five thousandths (0.035) of an inch.

Preferably the width dimension of the bridge portion of the solder mound (and the pad) is within a range of approximately five thousandths (0.005) of an inch to approximately twenty thousandths (0.020) of an inch, as shown in plan view in FIG. 13D. It is theorized that if the width dimension of the bridge portion of the solder mound (and the pad) is substantially less than five thousandths (0.005) of an inch, then there will be insufficient solder wetting of the pad and component lead, and insufficient registration as the extremity of the component lead contacts the bridge portion. It is theorized that if the width dimension of the bridge portion of the solder mound (and the pad) is substantially greater than twenty thousandths (0.020) of an inch, then pad and component density would be limited. Preferably, the width dimension of the bridge portion of the solder mound (and the pad) is approximately ten thousandths (0.010) of an inch.

Figure 14:
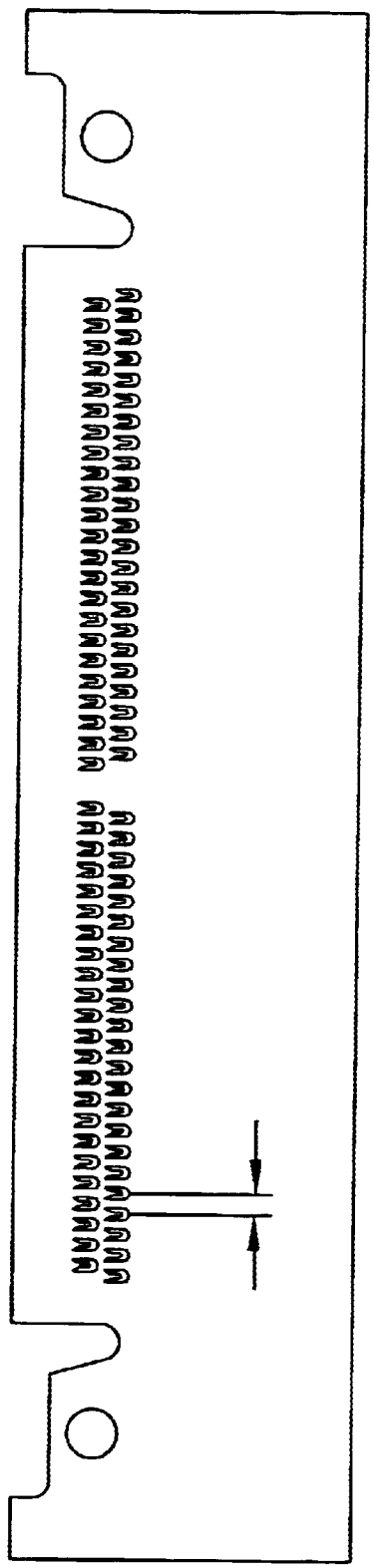
FIG. 14 is a plan view of a preferred array of the invention.

As shown in plan view in FIG. 14, in the preferred embodiment of the invention an array of the U-shaped metalized pads is deposited on a surface of the printed circuit board 100. In the preferred embodiment U-shaped metalized pads are arranged in one or more rows, and each U-shaped metalized pad of the array is similarly oriented. Preferably, the pads are arranged in a spaced apart relation with a range of approximately thirty thousandths (0.030) of an inch to approximately one hundred thousandths (0.100) of an inch. It is theorized that if the spaced apart relation is substantially less than thirty thousandths (0.030) of an inch, undesirable solder bridging between pads may result. It is theorized that if the spaced apart relation is substantially greater than one hundred thousandths (0.100) of an inch, then pad and component density would be limited. Preferably, the spaced apart relation is approximately fifty thousandths (0.050) of an inch.

Solder paste is applied to the pads of a first side of the printed circuit board in a manner as discussed in detail previously herein. The solder paste is heated to a molten state so that surface tension and wetting effects form the molten solder into a plurality of solder mounds that each contact a respective one of the U-shaped metalized pads, the solder mounds each having a respective U-shaped lateral cross section conforming to the respective U-shaped metalized pad. Each solder mound includes a respective first arm and second arm, a respective lateral aperture extending between the arms of each solder mound for receiving an extremity of a respective component lead; and a respective bridge portion extending between the arms of each solder mound.

Figure 15:
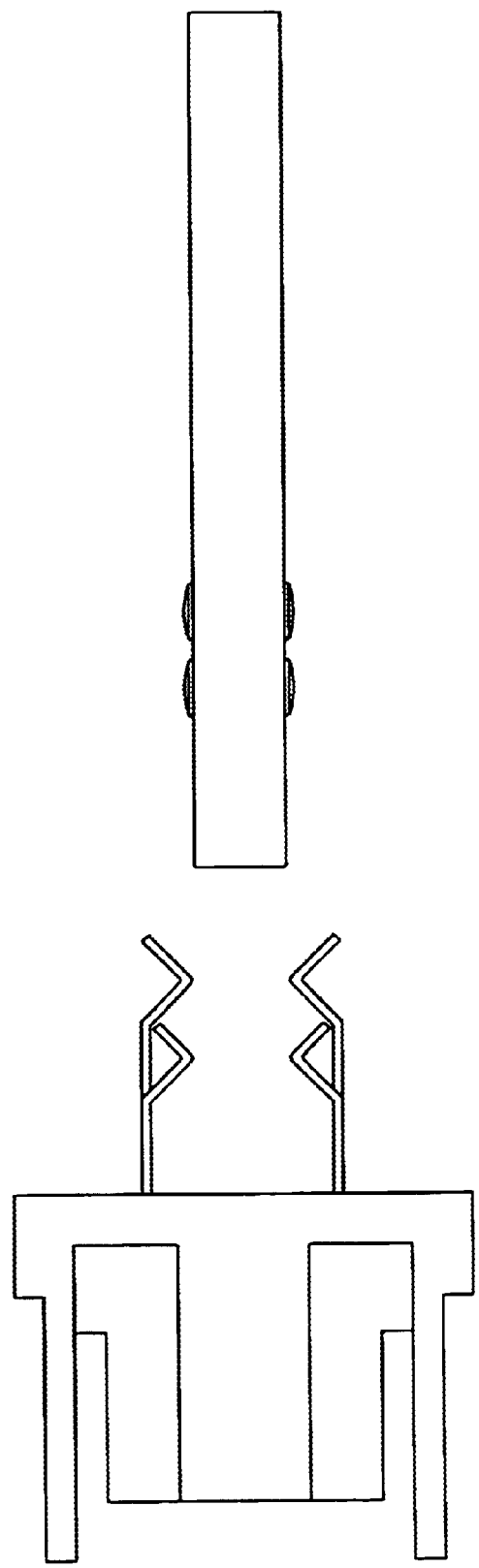
FIG. 15 is a side view of the preferred embodiment of the invention.
Figure 16:
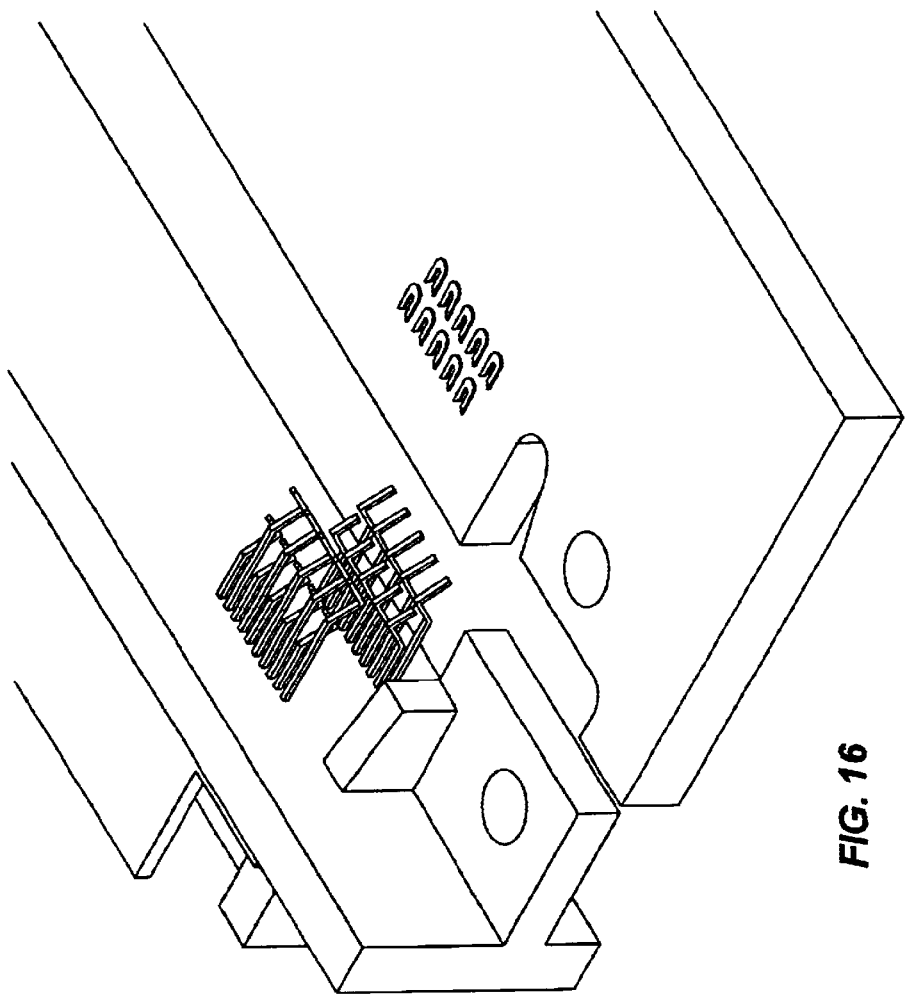
FIG. 16 is an isometric view of the preferred embodiment of the invention.

A particularly advantageous use of the invention is in conjunction with a Surface mount component, for example a straddle mount connector 150 as shown in side view in FIG. 15 and isometric view in FIG. 16, having a component lead for soldering to a pad on a first surface of the printed circuit board, and further having a component lead for soldering to a pad on an opposing surface of the printed circuit board. As shown, the U-shaped pads are preferably deposited on the surface of the printed circuit board proximate to an edge of the printed circuit board, so as to provide for advantageous use in conjunction with the connector.

The present invention provides a method and apparatus for printed circuit board pads with registering feature for component leads. Although specific embodiments of the invention have been described and illustrated, the invention is not to be limited to the specific forms or arrangements of parts so described and illustrate, and various modifications and changes can be made without departing from the scope and spirit of the invention. Within the scope of the appended claims, therefore, the invention may be practiced otherwise than as specifically described and illustrated.

What is claimed is:

1. A method comprising:

providing a solder mound having a U-shaped lateral cross section disposed along a surface of a printed circuit board, the solder mound having a lateral bridge portion, and having both first and second arm extremities extending in a longitudinal direction away from the bridge portion along the surface of the printed circuit board;

tapering the first and second arm extremities of the solder mound in the longitudinal direction away from the bridge portion along the surface of a printed circuit board, so as to form tapered solder mound extremities and a tapered solder mound aperture laterally therebetween;

disposing a component lead proximate to the tapered solder mound aperture; and registering the component lead in the tapered solder mound aperture along the tapered solder mound extremities.

2. A method as in claim 1 wherein the step of registering the component lead includes sliding the component lead along the surface of the printed circuit board in contact with at least one of the tapered solder mound extremities, so that the tapered solder mound aperture of the solder mound receives the component lead.

3. A method as in claim 1 wherein the step of registering the component lead includes sliding the component lead along the surface of the printed circuit board in contact with both of the tapered solder mound extremities, so that the tapered solder mound aperture of the solder mound receives the component lead.

4. A method as in claim 1 wherein the step of registering the component lead includes sliding the component lead into contact with the lateral bridge portion of the solder mound, so as to register the component lead with respect to the lateral bridge portion of the solder mound.

5. A method comprising:

providing a solder mound having a U-shaped lateral cross section disposed along a surface of a printed circuit board, the solder mound having both first and second arm extremities extending in a longitudinal direction along the surface of the printed circuit board;

tapering the first and second arm extremities of the solder mound in the longitudinal direction away from the bridge portion along the surface of a printed circuit board, so as to form tapered solder mound extremities and a tapered solder mound aperture laterally therebetween;

disposing a component lead proximate to the tapered solder mound aperture;

laterally registering the component lead in the tapered solder mound aperture along the tapered solder mound extremities.

* * * * *